United States Patent
Lee et al.

(10) Patent No.: US 9,893,819 B1
(45) Date of Patent: Feb. 13, 2018

(54) DETERMINING FAR FIELD ERROR VECTOR MAGNITUDE (EVM) OF A DEVICE UNDER TEST OVER THE AIR (OTA)

(71) Applicant: Keysight Technologies, Inc., Minneapolis, MN (US)

(72) Inventors: Gregory S. Lee, Mountain View, CA (US); Gregory Douglas Vanwiggeren, San Jose, CA (US); Christopher Coleman, Santa Clara, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 15/416,957

(22) Filed: Jan. 26, 2017

(51) Int. Cl.
  H04B 17/00 (2015.01)
  H04B 17/10 (2015.01)
  G01R 29/10 (2006.01)

(52) U.S. Cl.
  CPC ........... *H04B 17/102* (2015.01); *G01R 29/10* (2013.01)

(58) Field of Classification Search
  CPC .............................. H04B 17/102; G01R 29/10
  USPC ...................................................... 455/115.4
  See application file for complete search history.

(56) References Cited

U.S. PATENT DOCUMENTS

| | | |
|---|---|---|
| 7,792,181 B2 | 9/2010 | Yamanouchi et al. |
| 8,169,993 B2 | 5/2012 | Huang et al. |
| 8,422,378 B2 | 4/2013 | Aoki |
| 8,626,079 B2 * | 1/2014 | Lee, II ............... H04L 1/0003 455/226.2 |
| 8,837,635 B2 * | 9/2014 | Lorenz ................ H03F 1/0216 375/295 |
| 2008/0151772 A1 | 6/2008 | Akita et al. |
| 2009/0264080 A1 * | 10/2009 | Huang ................. H04B 17/309 455/67.13 |
| 2009/0316589 A1 * | 12/2009 | Shafeeu ............... H04L 27/364 370/252 |
| 2013/0142236 A1 * | 6/2013 | Lee ........................ H04B 17/21 375/224 |

(Continued)

OTHER PUBLICATIONS

Devin Morris et al., "Synthetic DSP Approach for Novel FPGA-Based Measurement of Error Vector Magnitude," 2010 IEEE International Test Conference, 2010, pp. 1-8.

(Continued)

*Primary Examiner* — Sanh Phu

(57) ABSTRACT

A method determines far field EVM of a DUT using over-the-air (OTA) testing, the DUT having a transmitter/receiver and an antenna that are integrated together such that there is no connection port for interfacing a test system for directly measuring the EVM. Modulated RF signals transmitted by the DUT propagate OTA via the antenna. The method includes performing a near field scan of a bounded radiation surface, which includes measurement points at which waveforms of a repeatedly transmitted modulated RF signal are measured; downconverting the waveforms to intermediate frequency (IF), and digitizing the IF waveforms; synthesizing digital waveforms corresponding to the IF waveforms; accounting for corresponding RF propagation in the far field for the digital waveforms; providing a modulated digital IF waveform using the digital waveforms for which RF propagation has been accounted; and calculating EVM of the DUT in the far field using the modulated digital IF waveform.

25 Claims, 4 Drawing Sheets

(56) References Cited

U.S. PATENT DOCUMENTS

Figure 1:
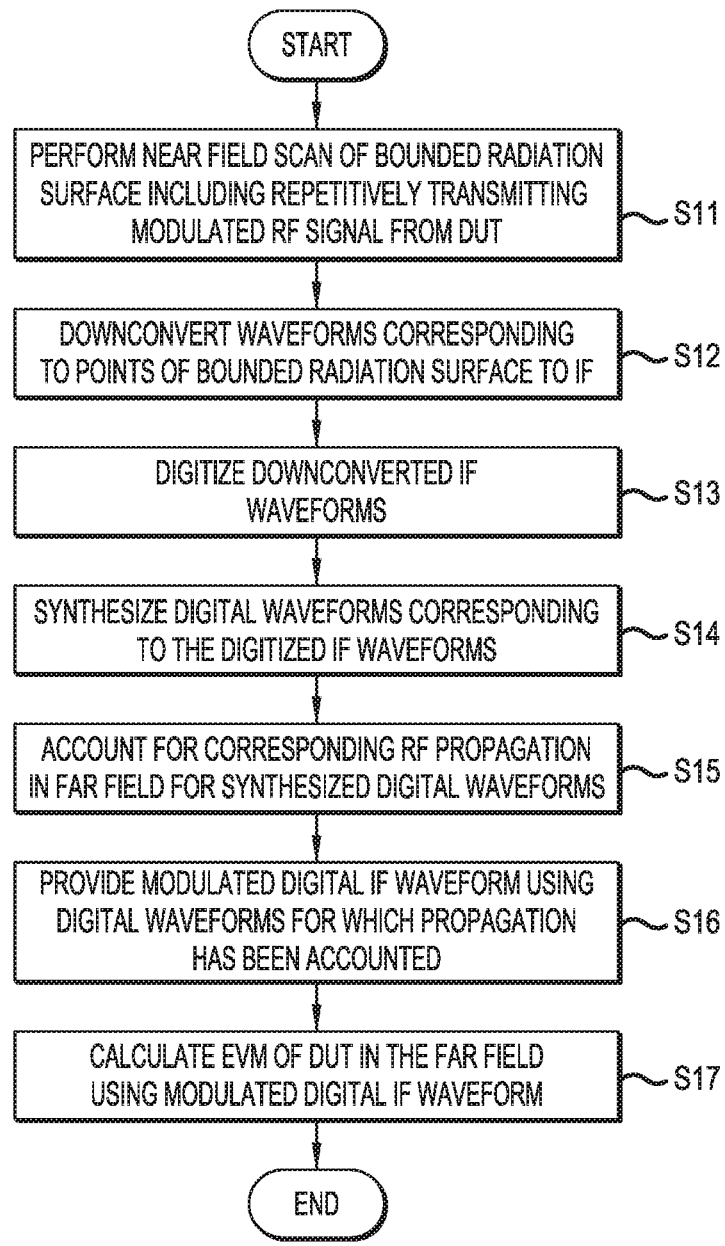

2015/0304075 A1* 10/2015 Ahmed ................... H04L 1/203
                                                         375/228

OTHER PUBLICATIONS

Co-pending U.S. Appl. No. 15/359,190, filed Nov. 22, 2016.

* cited by examiner

DETERMINING FAR FIELD ERROR VECTOR MAGNITUDE (EVM) OF A DEVICE UNDER TEST OVER THE AIR (OTA)

BACKGROUND

Next generation wireless communication technology includes highly integrated transceiver-antenna tandems, which may be referred to as active antenna systems (AAS's). In active antenna systems, the antenna is actually a phased array integrated into the transceiver. Accordingly, there is no RF connector that can be used for testing the transceiver and/or the antenna separately, as in conventional radio systems. Regardless, test system manufacturers and installers want to know the metrics that were traditionally measured in radio systems having RF connectors to accommodate such measurements. This may be accomplished using "over the air" (OTA) testing. The test metrics include several measurements, including measurements of effective isotropic radiated power (EIRP), total radiated power (TRP), effective isotropic sensitivity (EIS), signal to noise and interference ratio (SNIR), and error vector magnitude (EVM), for example. Although methods are being developed to test EIRP, TRP, EIS, and some other test metrics, there is no method presently available for performing OTA testing of EVM in a compact environment.

EVM OTA testing presents new challenges. For example, to ensure that errors in the modulation format constellation arise from an imperfectly transmitting device under test (DUT), and not from imperfect receive measurements, the measuring equipment necessarily must have high SNR during the test. This may be accomplished in conventional measurements of EVM using RF connectors. For OTA testing, the testing provides signals that are received after wireless propagation, and hence the test equipment must emulate a far field scenario. However, if the measurement is truly made in the far field, the signal is greatly diminished, so the SNR is poor, raising the question of where did the constellation error arise (if there is constellation error). Of course, the same issue is present when the DUT is receiving and the test equipment is transmitting. Thus, there is a need for a compact method of measuring and/or characterizing EVM over the air (OTA) for active antenna systems.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

FIG. 1 is a flow diagram of a method for determining EVM OTA for an active antenna system in the far field, according to representative embodiments.

FIG. 2 is a simplified schematic diagram of a method for determining EVM OTA for an active antenna system in the far field, according to a representative embodiment.

FIG. 3 is a simplified schematic diagram of a method for determining EVM OTA for an active antenna system in the far field, according to a representative embodiment.

FIG. 4 is a simplified schematic diagram of a method for determining EVM OTA for an active antenna system in the far field, according to a representative embodiment.

DETAILED DESCRIPTION

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors.

Generally, according to various embodiments, a system and method are provided for OTA testing of signal impairments (e.g., EVM) in a far field (FF) using techniques for measurements in a near field (NF), including actual near field probing, followed by digitally synthesizing a far field scenario from the near field probing, thereby recreating an equivalent far field signal impairment situation. An example of near field testing of a DUT is described by Lee et al. in U.S. patent application Ser. No. 15/359,190 (filed Nov. 22, 2016), which is hereby incorporated by reference in its entirety, although other methods of near field testing may be incorporated without departing from the scope of the present teachings.

FIG. 1 is a simplified flow diagram of a general method for determining EVM OTA for an active antenna system of a DUT in the far field, according to representative embodiments.

Referring to FIG. 1, a method is provided for determining a signal impairment (e.g., EVM) of a DUT in a far field using over-the-air (OTA) testing, where the DUT has a transmitter and/or a receiver and a DUT antenna that are integrated together such that there is no connection port for interfacing a test system to directly measure the signal impairment. In the depicted embodiment, an RF signal modulated by an RF modulation test sequence is repeatedly transmitted by the DUT and propagates OTA via the DUT antenna. The modulated RF signal is acquired by scanning a bounded radiation surface in the near field, where the bounded radiation surface has multiple measurement points. The modulated RF signal is repeatedly transmitted to enable determination of when each measurement point on the bounded radiation surface receives the same iteration of the modulated RF signal. This may be accomplished using by various acquisition techniques, such as repeatedly triggering acquisition by digitizers (e.g., analog-to-digital converters (ADCs) in a near field RF receiver) to start at the same times the DUT is repeatedly triggered to start transmission of the modulated RF signal for each measurement point of the bounded radiation surface. This coordinates the transmission and acquisition for each measurement point. Alternatively, the acquisition by the digitizers may simply run at a constant rate, while the DUT is repeatedly triggered to start transmission of the modulated RF signal for each measurement point of the bounded radiation surface. By tracking the time at which each modulated RF signal is triggered for transmission, the corresponding acquisition of the modulated RF signal at particular measurement points of the bounded radiation surface may be calculated. Also, instead of triggering, another alternative would be for the DUT and the digitizers to share a common clock, so that the transmissions by the DUT and corresponding acquisitions at the measurement points of the bounded radiation surface may be determined, as long as the modulated RF signal is repetitive after an integer number of digitized samples and acquisition at the measurement points is restarted at the beginning of each repetition. Of course, any acquisition technique that enables matching of repetitive modulated RF signal transmissions with corresponding acquisitions at bounded radiation surface measurement points may be incorporated without departing from the scope of the present teachings.

The bounded radiation surface is a finite, virtual surface in three-dimensional space. The bounded radiation surface may be one of a variety of shapes, such as planar, cylindrical, spherical, or any other shape enabling measurements of the modulated RF signal in the near field. The bounded radiation surface roughly bounds the extent of the DUT antenna portion of the DUT, and the shape may be determined and/or selected by a user, such as the test system manufacturer, the test system installer or the customer (selecting from the shapes offered by the test system manufacturer), for example. Near field waveforms are measured at points in multiple directions from the DUT antenna to provide a two-dimensional or three-dimensional matrix indicating waveform locations. The far field vectors determined from these measured near field points are indicated by angular directions or vectors since a far field pattern is a distribution over a sphere.

In step S11 of FIG. 1, near field scans of the bounded radiation surface are performed to acquire at measurement points on the bounded radiation surface a modulated RF signal repetitively transmitted by the DUT, as discussed above. The acquisitions at the measurement points may be referred to as near field RF waveforms, which are measured in the near field. In an embodiment, the near field scans of the bounded radiation surface are performed using a repetitively triggered modulated RF signal, which is triggered for transmission from the DUT transmitter for each of the measurement points (or locations) of the bounded radiation surface, as discussed above. Each of the RF waveforms is downconverted to an intermediate frequency (IF) in step S12, and the resulting IF waveforms are digitized, e.g., by an ADC, in step S13.

Digital waveforms corresponding to the digitized IF waveforms (from the ADC) are synthesized in step S14, e.g., by a digital signal processor (DSP). In step S15, corresponding RF propagation in the far field is accounted for with respect to each of the synthesized digital waveforms. A modulated digital IF waveform is provided in step S16 using the digital waveforms for which corresponding RF propagation has been accounted. In step S17, the EVM of the DUT is calculated in the far field using the modulated digital IF waveform.

Figure 2:
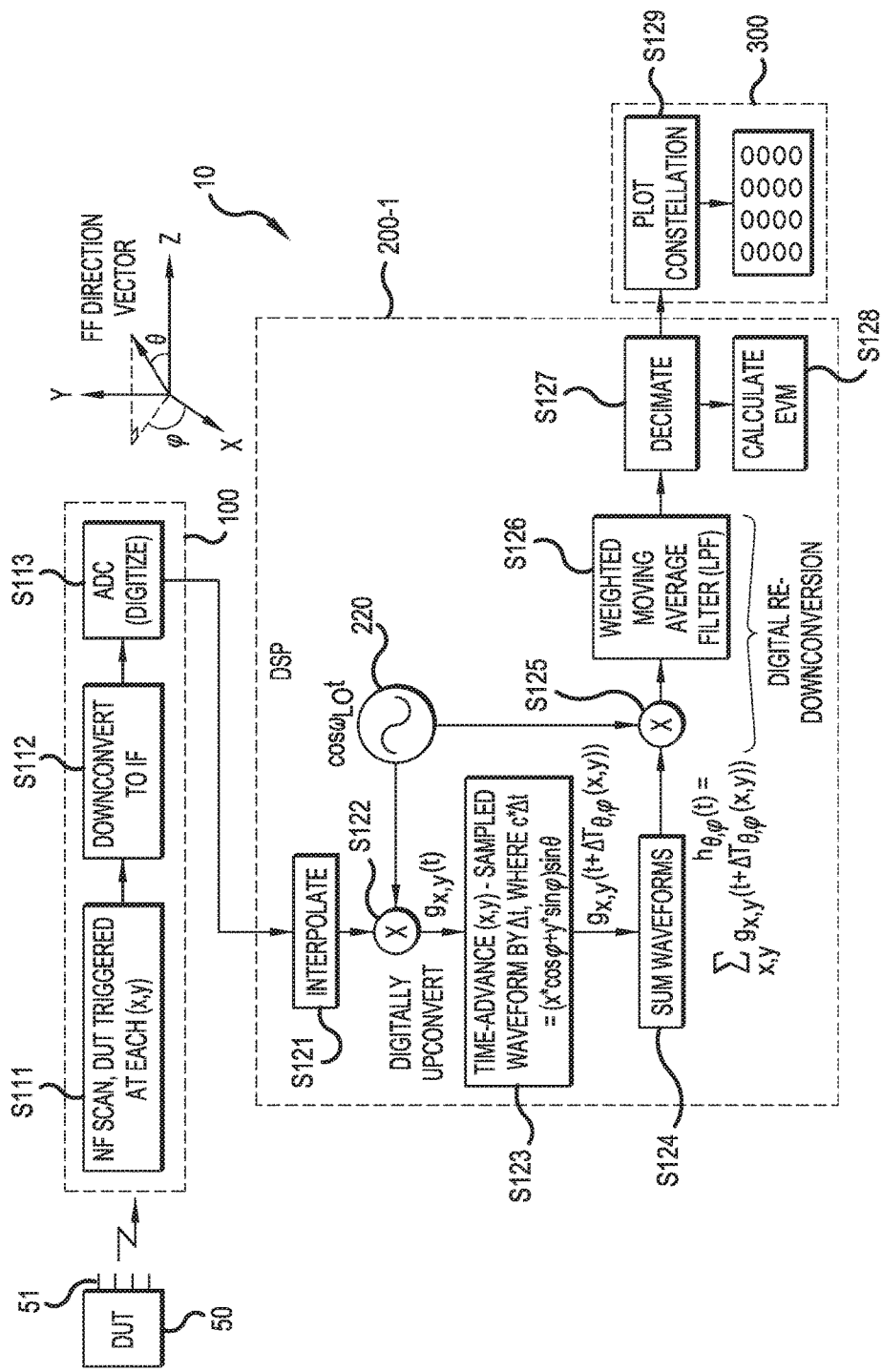
Figure 3:
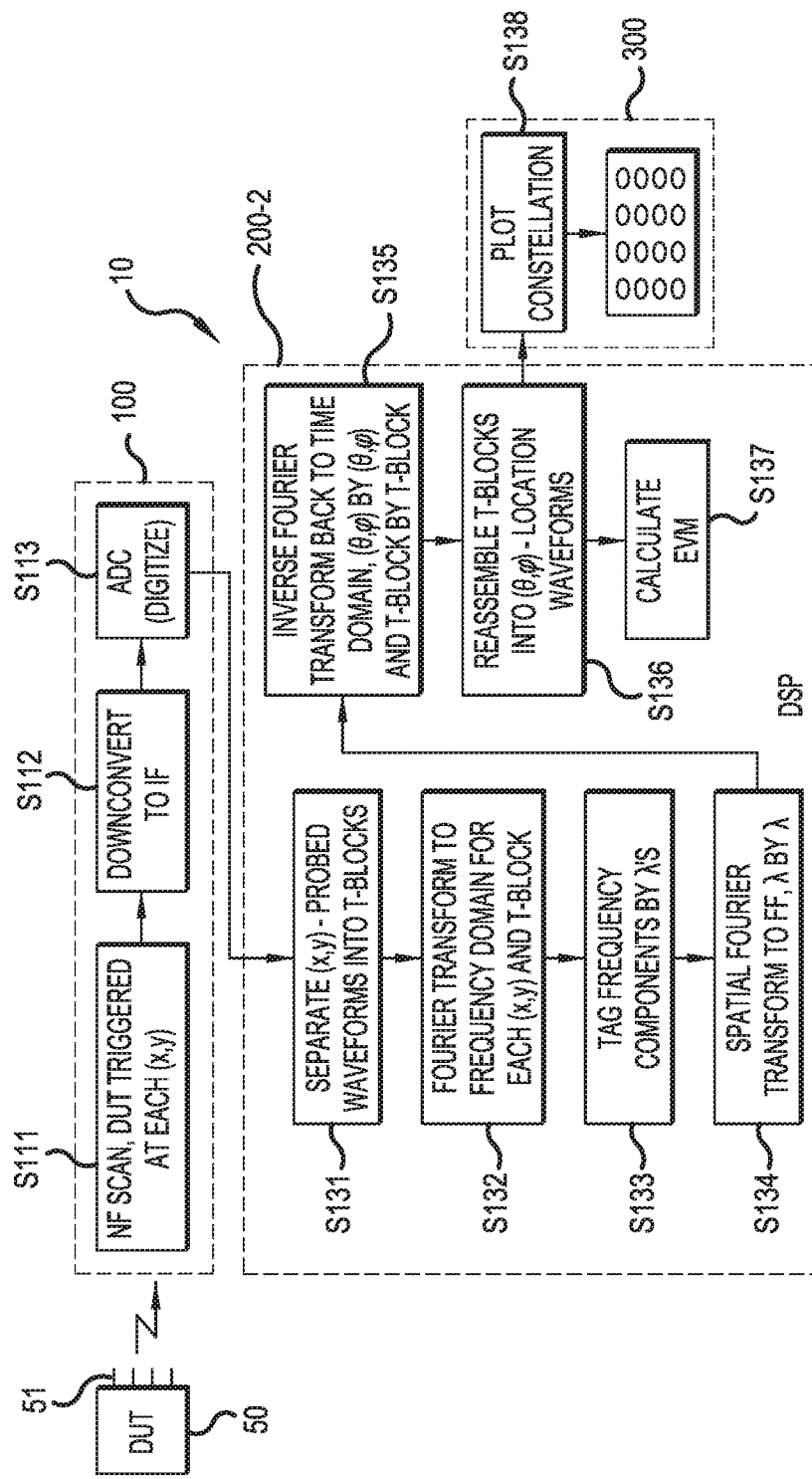
Figure 4:
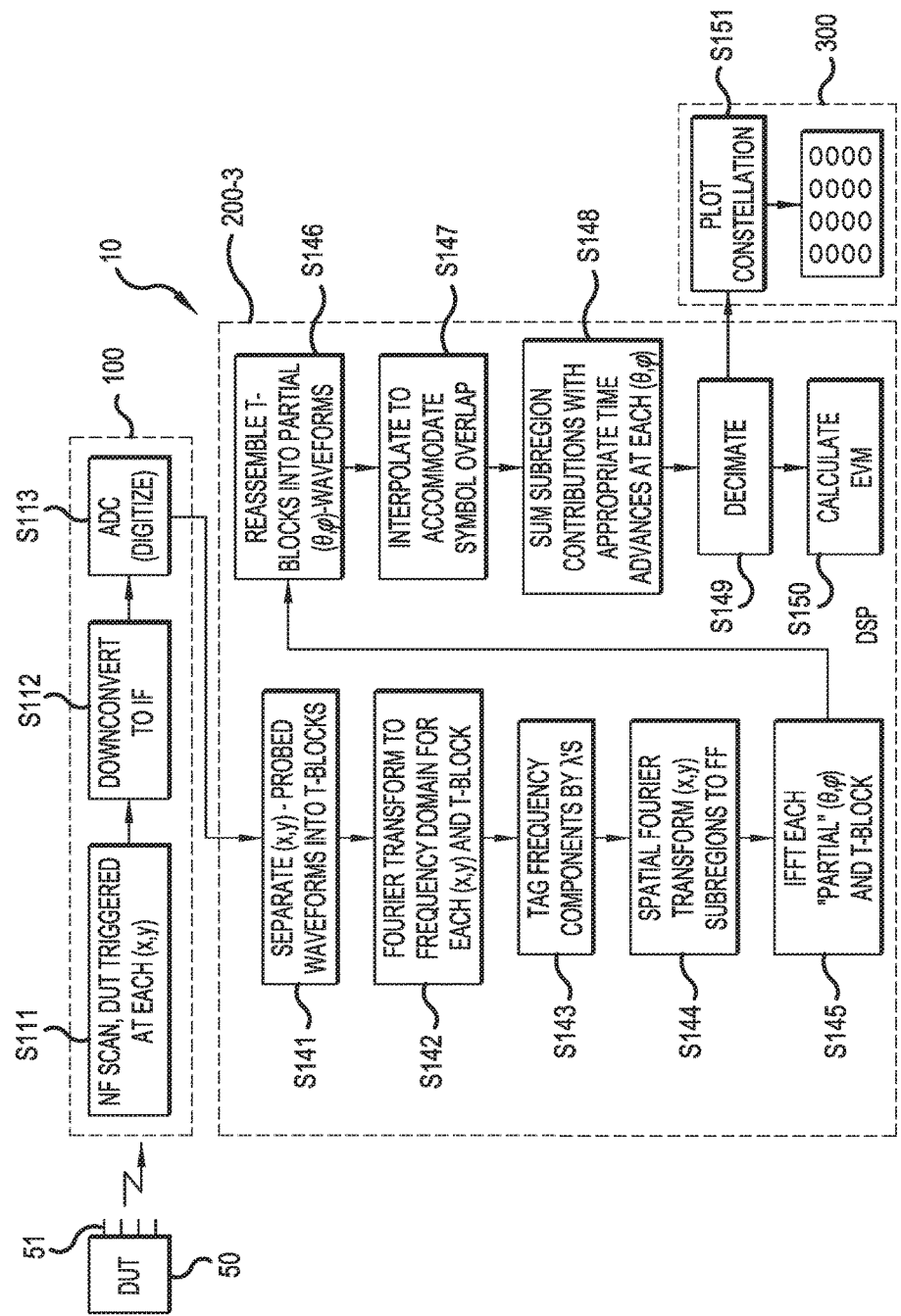

FIGS. 2 to 4 are simplified flow diagrams depicting various embodiments of the disclosure generally provided in FIG. 1. For ease of explanation, it is assumed in FIGS. 2 to 4 that measurements of the repetitively transmitted RF signals are performed over a planar bounded radiation surface, represented by multiple points (x,y) at which near field waveforms are measured, respectively. The far field vectors determined from the measurement points (x,y) are indicated by angular directions (θ,φ) since a far field pattern is a distribution over a sphere and not a plane, for example.

FIG. 2 is a simplified flow diagram of a method for determining EVM OTA (OTA EVM testing) for an active antenna system of a DUT in the far field, according to a representative embodiment. The method is based on the further assumption that the near field can be adequately probed for amplitude and phase of the DUT configuration, where the DUT configuration includes a given RF weighting and phasing of phased array elements, for example.

More particularly, FIG. 2 depicts methodology for testing a DUT transmitter using OTA EVM testing, presented in a time-domain signal processing scheme. The methodology is implemented by representative test equipment system 10, including near field measurement system 100, DSP 200-1 (programmed with the far field EVM algorithm discussed below) and display device 300, each of which is indicted by dashed lines, for testing representative DUT 50. Of course, the various steps may be executed by other devices depicted in FIG. 1, or additional hardware and/or software, without departing from the scope of the present teachings.

The DSP 200-1 (as well as DSPs 200-2 and 200-3, discussed below) may be implemented by a computer processor, field-programmable gate arrays (FPGAs), application specific integrated circuits (ASICs), or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system. A memory (not shown) may be implemented by any number, type and combination of random access memory (RAM) and read-only memory (ROM), for example, and may store various types of information, such as computer programs and software algorithms executable by the computer processor (and/or other components), as well as raw data and/or data storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are non-transitory (e.g., as compared to transitory media, such as propagating signals).

A user interface (I/F) (not shown) for enabling interaction with a user and/or another test system. For example, the user I/F may include a display, such as display device 300 for displaying plot constellations, for example, as discussed below, as well a user input device configured to receive user commands. The user input device may include a keyboard, a mouse, a touch pad and/or a touch-sensitive display, although any other compatible means of providing input may be incorporated without departing from the scope of the present teachings. The user I/F may be used, for example, to enable a user to set predetermined thresholds for determining occurrences of large errors (e.g., metastable errors).

The DUT 50 includes an RF transmitter (not shown) and a DUT antenna 51 integrated with the RF transmitter, such that there is no connection port for interfacing the near field measurement system 100 with the DUT antenna 51 to directly measure the EVM. In an embodiment, the DUT antenna 51 may be a phased array antenna, for example. Alternatively, the DUT 50 may have an RF receiver integrated with the DUT antenna 51, instead of or in addition to the RF transmitter (e.g., a transceiver), without departing from the scope of the present teachings. However, for ease of illustration, the DUT 50 is assumed to have only the RF transmitter integrated with the DUT antenna.

The DUT antenna 51 repetitively transmits a modulated RF signal that propagates OTA from the DUT 50. In the depicted embodiment, for each measurement point in a bounded radiation surface for measuring the modulated RF signal, the RF transmitter is repeatedly triggered to send the modulated RF signal. As discussed above, the modulated RF signal may be modulated by a typical RF modulation test sequence, such as a pseudorandom bit sequence (PRBS), for example. The modulation may be any commonly used format, including binary, QPSK, 16-QAM, and 64-QAM, for example. RF modulation test sequences are standard in EVM testing using a conventional RF connector, as would be apparent to one skilled in the art. The repetitively transmitted modulated RF signal is received by an RF receiver in the near field measurement system 100, by performing a near field scan of the bounded radiation surface in step S111. The bounded radiation surface includes multiple measurement points (x,y) at which near field RF waveforms are measured. Each of the RF waveforms is downconverted to an intermediate frequency (IF) in step S112, and the IF waveforms are digitized in step S113 (e.g., by an analog-to-digital converter (ADC)). The digitized IF waveforms are provided to the DSP 200-1, and may be stored in memory (not shown), as well. Thus, blocks S111, S112 and S113 in FIG. 1 depict actual physical measurement of the AAS near field transmission in the near field.

The DSP 200-1 is configured to execute a method for synthesizing the far field EVM, using the digitized IF waveforms from the near field measurement system 100. The synthesizing is performed in the digital domain using digital signal processing. Angular direction (θ,φ) for the EVM of interest is provided to the DSP 200-1. In an embodiment, the angular direction (θ,φ) is input via the user I/F discussed above by a user, such as a test system manufacturer of the DUT 50, a test system installer, and/or the customer, although alternative techniques for providing the angular direction (θ,φ) may be implemented without departing from the scope of the present teachings.

The angular direction (θ,φ) identifies for the test equipment system 10 the angular direction (θ,φ) for which in the far field EVM is to be determined (e.g., the far field direction). As shown by the coordinate system in FIG. 2, the far field direction is specified as a vector including a declination value (angular direction θ) from a boresight axis (e.g., z-axis) perpendicular to a plane of the DUT antenna 51 and an azimuth value (angular direction φ) from an axis (e.g., x-axis) perpendicular to the boresight axis. For single-beam configurations, as shown by the coordinate system in FIG. 1, this would be the direction toward which the DUT antenna (i.e., phased array antenna) is supposed to be pointing the beam of the transmitted RF signal. Of course, the embodiments disclosed herein are not limited to single-beam configurations, and thus may accommodate multi-beam configurations, such as those used in multiple-input and multiple-output (MIMO) wireless communication devices. In this case, multiple angular directions (θ,φ) identify the multiple vectors for corresponding far field directions to provide multiple far field EVMs at the different relative locations. In other words, for multi-beam configurations, a set of angular directions (θ,φ) is used, where the set includes simultaneous beams (e.g. "partial beams") with corresponding angular directions $(\theta_i,\varphi_i)$, where i is a positive integer incrementing from 1 to n (which is 2 or more).

In step S121, the digitized IF waveforms for all sampled near field measurement points (x,y) are time interpolated. This involves adding (unmeasured) time data points into the digitized IF waveforms. Any DSP interpolation method, such as linear interpolation, sinc interpolation, splines, and the like, may be incorporated without departing from the scope of the present teachings. The interpolated digitized IF waveforms are multiplied by a digital facsimile of the original RF carrier (co)sine wave (indicated by block 220 and corresponding illustrative function $\cos(\omega_{LO}t)$ to recreate all the near field digital RF waveforms $g_{x,y}(t)$. That is, the digitized IF waveforms are upconverted in block 122 in order to synthesize corresponding digital RF waveforms $g_{x,y}(t)$ at substantially the same RF used in the near field RF scan (performed at step S111).

To synthesize a modulated RF waveform emanating from the DUT antenna 51 and propagating in the angular direction (θ,φ), a time advance Δt (or delay, depending on the situation) is computed, where the time advance Δt is required at each measurement point (x,y) of the bounded radiation surface to propagate such a waveform. The time advance Δt may be determined by Equation (1), where c is the speed of light in a vacuum (which suffices for speed of light in air):

$$\Delta t_{\theta,\varphi}(x,y) = ((x \cos \varphi + y \sin \varphi)\sin \theta)/c \qquad \text{Equation (1)}$$

In block 123, the local time advances are imposed on each of the digital RF waveforms, resulting in the time-shifted digital RF waveforms $g_{x,y}(t+\Delta t_{\theta,\varphi}(x,y))$. In various implementations, the time advances Δt may be pre-computed (i.e., prior to at least step S113). In step S124, the time-advanced digital RF waveforms $g_{x,y}(t+\Delta t_{\theta,\varphi}(x,y))$ are summed to provide a representative modulated digital RF waveform $h_{\theta,\varphi}(t)$ transmitted in a far field direction indicated by declination value θ and azimuth value φ. That is, the superposition of these time-shifted digital RF waveforms represents the modulated digital RF waveform propagating in the direction (θ,φ) of the far field. The modulated digital RF waveform $h_{\theta,\varphi}(t)$ is provided by Equation (2) (as well as the flow diagram in FIG. 1), where the digital sum is over all (x,y) sample points:

$$h_{\theta,\varphi}(t) = \Sigma g_{x,y}(t+\Delta t_{\theta,\varphi}(x,y)) \qquad \text{Equation (2)}$$

Next, the modulated digital RF waveform $h_{\theta,\varphi}(t)$ is downconverted to an intermediate frequency (IF), which may be the same IF of the digitized IF waveforms input to the DSP

200-1. That is, the modulated digital RF waveform $h_{\theta,\varphi}(t)$ is digitally downconverted to a modulated digital IF waveform at substantially the same frequency as the digitized IF waveforms provided by ADC in step S113. The downconversion may be accomplished by multiplying the modulated digital RF waveform $h_{\theta,\varphi}(t)$ by the same digital facsimile of the original RF carrier (co)sine wave (indicated by block 220 and corresponding illustrative function $\cos(\omega_{LO}t)$ at step S125, and low pass filtering (LPF) the result in step S126, e.g., to remove frequency components near the second harmonic of the carrier. In the digital domain, the low pass filtering may be performed using a flat-weight moving average filter, for example, which has a sinc function response in the frequency domain. Depending on the ratio of the modulation bandwidth of the modulated digital IF waveform to the second harmonic frequency, this may suffice. If not, tapered weighting may be introduced, where a triangular weighting process produces a $sinc^2$ frequency response. In various embodiments, known Blackman and/or Gaussian filters may also be incorporated to produce even better frequency response. The filtered modulated digital IF waveform may be referred as a filtered far field waveform.

The filtered far field waveform is decimated in step S127 to undo the interpolation, thus providing a digitized IF waveform corresponding to an IF waveform that would be downconverted by an ideal receiver in the far field angular direction $(\theta,\varphi)$. Accordingly, the measured bounded radiation surface with points (x,y) in the near field is converted to an emulated angular direction $(\theta,\varphi)$ in the far field. The far field EVM calculations are performed in step S128, and the far field constellation depicting the far field EVM is plotted in step S129. The plotted constellation may be displayed on display device 300, with or without calculated EVM values. The calculated far field EVM values and the displayed far field constellation would be substantially the same as though they were provided using a conventional connector-received waveform from a DUT having a physical antenna connection (not present in an integrated transceiver/antenna DUT, such as DUT 50, discussed above).

The interpolation in step S121 may require somewhat extensive computational processing by the DSP 200-1. However, next generation (5G) systems will likely be designed with very large modulation bandwidths, and hence the amount of interpolation is not necessarily that large. (The amount of interpolation is generally determined by the ratio of the RF carrier frequency to the modulation bandwidth.) Also, for multi-beam configurations, the near field method outlined above is efficient in that the same physical scan (e.g., step S111) applies to all of the partial beams. Therefore, only the time advances $\Delta t(x,y)$ appropriate to the multiple choices of $(\theta,\varphi)$ need to be computed, and the other steps of the algorithm performed by the DSP 200-1 are performed for each choice.

Also, for a given configuration, whether single-beam or multi-beam, if one is not interested in EVM at the nulls in the far field pattern, the near field scan may be programmed to skip weak measurement points (x,y). Here, "weak" means that certain near field locations are known to emit power well below the strong near field locations, e.g., from the DUT design or from previous carrier wave measurements of the same near field configuration. Test system manufacturers and installers, for example, typically are not interested in measuring EVM at far field nulls.

FIG. 3 is a simplified flow diagram of a method for determining EVM OTA for an active antenna system of a DUT in the far field, according to another representative embodiment. The method is again based on the assumptions that the bounded radiation surface is planar and that the near field can be adequately probed for amplitude and phase of the DUT configuration, where the DUT configuration includes a given RF weighting and phasing of phased array elements, for example. The method of FIG. 3 differs somewhat from that of FIG. 2 in that the far field EVM is derived substantially in the frequency domain (through Fourier transform), instead of the time domain, as in the method depicted in FIG. 2. The methodology is implemented by representative test equipment system 10, including near field measurement system 100, DSP 200-2 (programmed with the far field EVM algorithm discussed below) and display device 300, each of which is indicted by dashed lines, for testing the representative DUT 50. Of course, the various steps may be executed by other devices depicted in FIG. 3, or additional hardware and/or software, without departing from the scope of the present teachings.

As discussed above, a modulated RF signal is repeatedly transmitted from the DUT antenna 51, e.g., by triggering the DUT 50, and received by an RF receiver in the near field measurement system 100, which performs a near field scan of the bounded radiation surface in step S111. The bounded radiation surface includes multiple measurement points (x,y), at which the repetitive modulated RF signal is measured, to provide near field RF waveforms. Each of the RF waveforms is downconverted to an IF in step S112, and the IF waveforms are digitized in step S113. The digitized IF waveforms are provided to the DSP 200-2, and may be may stored in memory (not shown), as well. Thus, blocks S111, S112 and S113 in FIG. 3 depict actual physical measurement of the DUT transmitter configuration in the near field.

The DSP 200-2 is configured to execute a method for synthesizing the far field EVM, using the digitized IF waveforms from the near field measurement system 100. The synthesizing is performed in the digital domain using digital signal processing. At large modulation bandwidths, the far field radiation pattern is slightly different for the different frequency/wavelength components of the transmitted waveform. Thus, the spectrum is divided or separated into bins to account for this frequency-dependent far field pattern effect. The bins may be obtained using fast Fourier transform (FFT) techniques applied to the space-time data, but before doing so, the digitized IF waveforms are divided into blocks, the sizes of which are reduced, especially in the temporal direction, to practical FFT lengths that can be efficiently handled. The temporal sequence length can be much larger than the spatial data lengths because very long PRBS sequences, for example, may be used when the modulation format of the repetitive modulated RF signal is aggressive and has a dense constellation.

Accordingly, in step S131, the digitized IF waveforms from the near field measurement system 100 are separated into time blocks, where each time block has a predetermined duration T (referred to as "time block T" or "T-block"). In step S132, FFTs are performed on the digitized IF waveforms in each time block T to provide frequency domain IF waveforms. Frequency components of the frequency domain IF waveforms are "tagged" by wavelengths ($\lambda$'s) in step S133 in order to separate the frequency domain IF waveforms into multiple wavelength bins (which may likewise be referred to as frequency bins) according to the wavelengths (or frequencies) of the frequency components, where the wavelength bins cover a full spectrum of the frequency domain IF waveforms.

One reason for converting to the frequency domain in step S132 is to allow well-known "near-field-to-far-field" transformation wavelength-centric techniques. However, as stated above, for large modulation bandwidths, there are a large number of wavelengths λ involved. Hence, the frequency components are tagged in step S133 by wavelengths λ to effectively provide coarse wavelength binning of the frequency data produced by the FFTs in step S132. The coarse wavelength binning is just fine enough to account for the frequency-dependent radiation pattern.

Referring again to step S131, the durations of the time blocks T are chosen for the local downconverted digitized IF waveforms such that the time-frequency uncertainty principle is comfortably respected. That is, if $\Delta\omega_{bin}$ is the angular frequency bin width (in radians/second) and T is the time block duration (in seconds), then the uncertainty principle says that $\Delta\omega_{bin}T \geq \frac{1}{2}$. Generally, it is good practice to be at least approximately 100 times the uncertainty limit, so a reliable size of the time block T is provided, as a practical matter, indicated by Equation 3:

$$\Delta\omega_{bin}T > 50 \qquad \text{Equation (3)}$$

It also improves efficiency of the FFT processing to choose the number of digitized time samples within the time block T to be a power of two. Likewise, it improves efficiency for the number of spatial samples in both the x- and y-directions of the measurement points (x,y) in the bounded radiation surface for measuring the modulated RF signals from the DUT antenna 51 to be powers of two. Such efficiencies are not strictly necessary, since modern DSPs may use "padding" to effectively interpolate sequences to the next power of two whenever the number of digitized time samples and/or the number of spatial samples are not powers of two. As far as the number of frequency bins is concerned, Table 1 below provides illustrative estimates for anticipated 5G millimeter-wave bands.

TABLE 1

| 5G band (GHz) (FCC July 2016) | No. of bins where $\Delta f_{bin} < 0.01 * f_{carrier}$ |
|---|---|
| 27.5-28.35 | 4 |
| 37-40 | 8 |
| 64-71 | 16 |

The frequency bin rule $\Delta f_{bin} < 0.01 * f_{carrier}$ is chosen so that any finer frequency binning has no practical impact on the far field radiation pattern. In each case, the number of frequency bins has been rounded up to the nearest power of two to be compatible with modern FFT techniques, although this is not strictly necessary, as the number of frequency bins is not large. The $\Delta f_{bin}$'s are the same as the tagged wavelength bins, discussed above.

As a practical example of what a time block T may be like, using the information provided in Table 1 regarding the 28 GHz band, Equation (3) would yield T approximately equal to 40 ns. That is, $f_{carrier}=28$ GHz, so $\Delta f_{bin}<280$ MHz. For T=40 ns, $2*\pi*\Delta f_{bin}*T=70>50$.

In step S134, spatial fast Fourier transform is performed on the frequency domain IF waveforms, wavelength bin by wavelength bin, to provide frequency domain IF waveforms in the far field to account for corresponding propagation in the far field. This spatial FFT step accomplishes the near-field-to-far-field transformation, e.g., from the near field measurement points (x,y) to the far field angular direction (θ,φ) for each wavelength bin. Inverse fast Fourier transforms (IFFT's) are performed on the frequency domain IF waveforms in the far field in step S135 to provide corresponding modulated digital IF waveform segments for the time blocks T, respectively, in the time domain. That is, the IFFT's convert the frequency domain information corresponding to the modulated digital IF waveform segments back to the time domain, but for each angular direction (θ,φ) in the far field, as opposed to the points (x,y) in the near field.

In step S136, the time blocks T are reassembled or reconnected to provide modulated digital IF waveforms transmitted (or received, depending on the configuration of the DUT 50) in a far field direction. Thus, the modulated digital IF waveforms include the modulated digital IF waveform segments from step S135 in the reassembled time blocks T. The reassembled time blocks T thus may be used to complete the time sequence data at one or more angular directions (θ,φ). That is, the reassembly of the time blocks can account for any and all angular directions (θ,φ) because the spatial Fourier transform output from step S134 is actually a collection of outputs for all of the angular directions (θ,φ). The user may therefore select one the angular direction (θ,φ), or can reassemble up to all of the angular directions (θ,φ), and get the modulated digital IF waveforms for up to all the angular directions (θ,φ).

There may be stitching-related errors in the reassembly procedure due to imperfect carving of time. However, most of the frequency content of the missing time will be out-of-band, e.g., at DC and/or at frequencies much larger than the modulation bandwidth. Therefore, there would be little practical effect since such frequency content can be filtered out. Notably, unlike the method depicted in FIG. 2, all of the digital processing in FIG. 3 occurs at the downconverted IF. Only the wavelength tags λ convey the notion of RF OTA propagation.

The far field EVM calculations are performed in step S137, and the far field constellation depicted the far field EVM is plotted in step S138. The plotted constellation may be displayed on display device 300, with or without calculated EVM values. The calculated far field EVM values and the displayed far field constellation would be substantially the same as though they were provided using a conventional connector-received waveform from a DUT having a physical antenna connection (not present in an integrated transceiver/antenna DUT, such as DUT 50, discussed above).

One advantage of the frequency domain based methodology shown in FIG. 3 over the time domain based methodology shown in FIG. 2 is that the far field waveforms for all angular directions (θ,φ) are automatically produced. Hence, the far field EVM can be calculated for a large number of angular directions (θ,φ) of beams very quickly.

FIG. 4 is a simplified flow diagram of a method for determining EVM OTA for an active antenna system of a DUT in the far field, according to another representative embodiment. The method is again based on the assumptions that the bounded radiation surface is planar and that the near field can be adequately probed for amplitude and phase of the DUT configuration, where the DUT configuration includes a given RF weighting and phasing of phased array elements, for example. The method of FIG. 4 differs somewhat from that of FIG. 2 in that the far field EVM is derived substantially in the frequency domain, as discussed above with reference to FIG. 3, instead of the time domain, as discussed above with reference to FIG. 2. The method of FIG. 4 is essentially a modified Fourier-based technique for calculating EVM OTA when inter-area intersymbol interference is non-negligible. As in FIGS. 2 and 3, all operations of FIG. 4 following the near field measurement system 100 are performed digitally.

The methodology is implemented by representative test equipment system 10, including near field measurement system 100, DSP 200-3 (programmed with the far field EVM algorithm discussed below) and display device 300, each of which is indicted by dashed lines, for testing the representative DUT 50. Of course, the various steps may be executed by other devices depicted in FIG. 4, or additional hardware and/or software, without departing from the scope of the present teachings.

As discussed above, modulated RF signal is repeatedly transmitted from the DUT antenna 51, e.g., by triggering the DUT, and received by an RF receiver in the near field measurement system 100, which performs a near field scan of the bounded radiation surface in step S111. The bounded radiation surface includes multiple measurement points (x,y), at which the repetitive modulated RF signal is measured, to provide near field RF waveforms. Each of the RF waveforms is downconverted to an IF in step S112, and the IF waveforms are digitized in step S113. The digitized IF waveforms are provided to the DSP 200-3, and may be may stored in memory (not shown), as well. Thus, blocks S111, S112 and S113 in FIG. 4 depict actual physical measurement of the DUT transmitter configuration in the near field.

The DSP 200-3 is configured execute a method for synthesizing the far field EVM, using the digitized IF waveforms from the near field measurement system 100. The synthesizing is performed in the digital domain using digital signal processing. At large modulation bandwidths, the far field radiation pattern is slightly different for the different frequency/wavelength components of the transmitted waveform. Thus, the spectrum is divided or separated into bins to account for this frequency-dependent far field pattern effect. The bins may be obtained using FFT techniques applied to the space-time data, but before doing so, the digitized IF waveforms are divided into blocks, the sizes of which are reduced, especially in the temporal direction, to practical FFT lengths that can be efficiently handled, as discussed above with reference to FIG. 3.

However, in some specific situations, the simple FFT-based method of FIG. 3 is insufficient to properly characterize EVM. For example, when the aperture of the DUT 50 is large, and the beam so far off boresight (e.g., through poor positioning by the test system installer, the customer or other user) that the time difference of waveform arrival from different aperture extremities are comparable to or exceed a symbol period $\tau_{symb}$, then the method depicted in FIG. 3 may not provide accurate results. Of course, although this operating condition (which may be referred to as inter-area intersymbol interference ("$I^3$")) is ill advised and generally results in poor EVM, it may occur and may be handled by the method of FIG. 4.

In particular, FIG. 4 is Fourier-like technique that is a variant of the method discussed above with reference to FIG. 3, but still provides accurate EVM results in the presence of $I^3$. In step S141 of FIG. 4, the digitized IF waveforms from the near field measurement system 100 are separated into time blocks T (or sub-regions), each having a predetermined duration, within which intersymbol interference can be ignored. In these time blocks T, the Fourier-based method of FIG. 3 is essentially applied. That is, in step S142, FFT's are performed on the digitized IF waveforms in each time block T to provide frequency domain IF waveforms. Frequency components of the frequency domain IF waveforms are "tagged" by wavelengths (λ) in step S143 in order to separate the frequency domain IF waveforms into multiple wavelength bins according to the wavelengths of the frequency components, where the wavelength bins cover a full spectrum of the frequency domain IF waveforms. The durations of time blocks T, the number of frequency bins and the like, are determined as discussed above with reference to steps S131-S133 of FIG. 3, including discussion of Equation (3) and Table 1, and therefore will not be repeated.

In step S144, spatial FFT is performed on the frequency domain IF waveforms, wavelength-bin-by-wavelength-bin, to provide frequency domain IF waveforms in the far field to account for corresponding propagation in the far field. This spatial FFT step accomplishes the near field to far field transformation, e.g., from the near field points (x,y) to the far field angular direction (θ,φ) for each wavelength bin. IFFT's are performed on the frequency domain IF waveforms in the far field in step S145 to provide corresponding modulated digital IF waveform segments for the time blocks T, respectively, in the time domain. That is, the IFFT's convert the frequency domain information corresponding to the modulated digital IF waveform segments back to the time domain, but for each angular direction (θ,φ) in the far field, as opposed to the measurement points (x,y) in the near field. In step S146, the time blocks T are reassembled or reconnected to provide a modulated digital IF waveforms transmitted (or received) in far field directions. Thus, the modulated digital IF waveforms include the modulated digital IF waveform segments from step S145 in the reassembled time blocks T. The reassembled time blocks T thus complete the time sequence data at the angular directions (θ,φ).

In order to account for the cooperative contribution of all the time blocks T (subregions) to any modulated digital IF waveform segment (θ,φ), the centroids of each time block T are assigned time advances according to Equation (1), above. Due to the possible $I^3$, a limited amount of interpolation and subsequent decimation are performed before and after a time block T summation step, respectively, where the time block T summation step is analogous to the summation of the $g_{x,y}$ in step S124 of the spacetime-domain method in FIG. 2. Accordingly, the method depicted in FIG. 4 is somewhat of a hybrid between the methods depicted in FIGS. 2 and 3.

More particularly, in step S147 of FIG. 4, the reassembled modulated digital IF waveforms for all sampled near field measurement points (x,y) are time interpolated to accommodate symbol overlap occurring in the reassembled time blocks T. The reassembled time blocks T thus may be used to complete the time sequence data at one or more angular directions (θ,φ). The time block T contributions are summed with appropriate time advances (or delays, depending on the situation) at each angular direction (θ,φ) in step S148. As mentioned above, the time advances Δt may be determined according to Equation (1). In step S149, the far field modulated digital IF waveform is decimated to undo the interpolation, thus providing a digitized IF waveform corresponding to an IF waveform that would be downconverted by an ideal receiver in the far field angular direction (θ,φ).

The far field EVM calculations are performed in step S150, and the far field constellation depicted the far field EVM is plotted in step S151. The plotted constellation may be displayed on display device 300, with or without calculated EVM values. The calculated far field EVM values and the displayed far field constellation would be substantially the same as though they were provided using a conventional connector-received waveform from a DUT having a physical antenna connection (not present in an integrated transceiver/antenna DUT, such as DUT 50, discussed above).

The various components, structures, parameters and methods are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A method of determining far field error vector magnitude (EVM) of a device under test (DUT) in a far field using over-the-air (OTA) testing, the method comprising:

performing a near field scan of a bounded radiation surface for measuring a modulated radio frequency (RF) signal repeatedly transmitted from the DUT, the bounded radiation surface comprising a plurality of measurement points at which the repeatedly transmitted modulated RF signal is measured to provide a corresponding plurality of RF waveforms in the near field;

downconverting each of the RF waveforms to an intermediate frequency (IF) to provide IF waveforms, and digitizing the IF waveforms;

digitally upconverting the digitized IF waveforms to synthesize a corresponding plurality of digital waveforms at substantially the same RF as the modulated RF signal in the near field scan;

time-advancing each digital waveform to account for corresponding propagation in the far field;

summing the time-advanced digital waveforms to provide a modulated digital RF waveform received or transmitted in a far field direction;

digitally downconverting the modulated digital RF waveform to a modulated digital IF waveform at substantially the same frequency as the digitized IF waveforms; and calculating the EVM of the DUT in the far field using the modulated digital IF waveform.

2. The method of claim 1, further comprising:
decimating the modulated digital IF waveform, wherein the EVM of the DUT in the far field is calculated using the decimated modulated digital IF waveform.

3. The method of claim 2, further comprising:
plotting a constellation of the decimated modulated digital IF waveform; and
displaying the constellation on a display device.

4. The method of claim 1, wherein the far field direction is specified as a vector comprising a declination value from a boresight axis perpendicular to a plane of an antenna of the DUT and an azimuth value from an axis perpendicular to the boresight axis.

5. The method of claim 1, further comprising:
time interpolating the digitized IF waveforms for the plurality of measurement points prior to digitally upconverting the digitized IF waveforms, the time interpolating comprising adding unmeasured time data points into the digitized IF waveforms; and
wherein digitally upconverting the digitized IF waveforms includes digitally upconverting the time interpolated digitized IF waveforms to synthesize the corresponding plurality of digital waveforms at substantially the same RF as the repeatedly transmitted modulated RF signal in the near field scan.

6. The method of claim 5, wherein the time interpolating comprises one of linear interpolation, sinc interpolation or splines.

7. The method of claim 1, further comprising:
low pass filtering the modulated digital IF waveform to remove frequency components near a second harmonic of a carrier of the modulated digital IF waveform.

8. The method of claim 7, wherein the low pass filtering is performed using a flat-weight moving average filter having a sinc function response in a frequency domain.

9. The method of claim 7, wherein the low pass filtering comprises tapered weighting, wherein a triangular weighting process produces a $sinc^2$ frequency response.

10. A method of determining far field error vector magnitude (EVM) of a device under test (DUT) in a far field using over-the-air (OTA) testing, the method comprising:

performing a near field scan of a bounded radiation surface for measuring a modulated radio frequency (RF) signal repeatedly transmitted from the DUT, the bounded radiation surface comprising a plurality of measurement points at which the repeatedly transmitted modulated RF signal is measured to provide a corresponding plurality of RF waveforms in the near field;

downconverting each of the RF waveforms to an intermediate frequency (IF) to provide IF waveforms, and digitizing the IF waveforms;

separating the plurality of digitized IF waveforms into time blocks, each time block having a predetermined duration;

performing fast Fourier transforms (FFTs) on the digitized IF waveforms in each time block to provide frequency domain IF waveforms;

tagging frequency components of the frequency domain IF waveforms by wavelengths, for separating the frequency domain IF waveforms into a plurality of wavelength bins according to the wavelengths of the frequency components, the plurality of wavelength bins covering a full spectrum of the plurality of waveforms;

performing spatial Fourier transform on the frequency domain IF waveforms, wavelength bin by wavelength bin, to provide frequency domain IF waveforms in the far field to account for corresponding propagation in the far field;

performing inverse fast Fourier transforms (IFFTs) on the frequency domain IF waveforms in the far field to provide corresponding modulated digital IF waveform segments for the time blocks, respectively, in a time domain;

reassembling the time blocks to provide modulated digital IF waveforms received or transmitted in one or more directions in the far field, the modulated digital IF waveforms comprising the modulated digital IF waveform segments from the reassembled time blocks; and calculating the EVM of the DUT in the far field using the modulated digital IF waveforms.

11. The method of claim 10, wherein a number of digitized IF waveforms in each time block is a power of two.

12. The method of claim 10, further comprising:
displaying a constellation of the modulated digital IF waveforms on a display device.

13. The method of claim 10, wherein the one or more far field directions are specified as vectors, each vector comprising a declination value from a boresight axis perpendicular to a plane of an antenna of the DUT and an azimuth value from an axis perpendicular to the boresight axis.

14. The method of claim 13, wherein a number of digitized IF waveforms in the reassembly of the time blocks account for all angular directions of the vectors.

15. The method of claim 10, further comprising:
time interpolating the modulated digital IF waveforms to accommodate for symbol overlap among the reassembled time blocks.

16. The method of claim 15, further comprising:
time-advancing each time block of the reassembled time blocks; and
summing the time-advanced reassembled time blocks at corresponding angular directions to provide summed far field modulated digital IF waveforms.

17. The method of claim 16, further comprising:
decimating the summed modulated digital IF waveforms to undo the time interpolating; and
calculating the EVM of the DUT in the far field using the modulated digital IF waveforms after decimation.

18. A method of determining far field error vector magnitude (EVM) of a device under test (DUT) in a far field using over-the-air (OTA) testing, the DUT having a transmitter and/or a receiver and a DUT antenna that are integrated together such that there is no connection port for interfacing a test system for directly measuring the EVM with the DUT antenna, a modulated radio frequency (RF) signal being repeatedly transmitted by the DUT propagates OTA via the DUT antenna, the method comprising:
performing a near field scan of a bounded radiation surface using an RF receiver for measuring the repeatedly transmitted modulated RF signal, the bounded radiation surface comprising a plurality of measurement points at which the repeatedly transmitted modulated RF signal is measured to provide a corresponding plurality of RF waveforms in the near field;
downconverting each of the RF waveforms to an intermediate frequency (IF) to provide IF waveforms, and digitizing the IF waveforms;
synthesizing a corresponding plurality of digital waveforms corresponding to the digitized IF waveforms;
accounting for corresponding RF propagation in the far field for each of the digital waveforms;
providing a modulated digital IF waveform using the digital waveforms for which corresponding RF propagation has been accounted; and
calculating the EVM of the DUT in the far field using the modulated digital IF waveform.

19. The method of claim 18, wherein the corresponding RF propagation in the far field for each of the digital waveforms is accounted for in a time domain.

20. The method of claim 18, wherein the corresponding RF propagation in the far field for each of the digital waveforms is accounted for in a frequency domain.

21. The method of claim 18, wherein performing the near field scan of the bounded radiation surface comprises repeatedly triggering the DUT to repeatedly transmit the modulated RF signal from the DUT.

22. The method of claim 21, wherein performing the near field scan of the bounded radiation surface further comprises repetitively triggering a digitizer in the RF receiver to start acquisition at the same times as the DUT is repeatedly triggered to start repeatedly transmitting the modulated RF signal, respectively, for each measurement point of the bounded radiation surface.

23. The method of claim 21, wherein performing the near field scan of the bounded radiation surface further comprises running a digitizer in the RF receiver at a constant rate, while the DUT is repeatedly triggered.

24. The method of claim 18, wherein performing the near field scan of the bounded radiation surface comprises sharing a common clock between the DUT and a digitizer in the RF receiver, and determining acquisitions at the measurement points of the bounded radiation surface corresponding to the repeatedly transmitted modulated RF signal from the DUT using the common clock.

25. The method of claim 1, wherein the modulated RF signal is modulated by a pseudorandom bit sequence (PRBS).

* * * * *